United States Patent
Kim et al.

(10) Patent No.: US 12,317,923 B2
(45) Date of Patent: Jun. 3, 2025

(54) AEROSOL GENERATING DEVICE

(71) Applicant: KT&G CORPORATION, Daejeon (KR)

(72) Inventors: Tae Hun Kim, Yongin-si (KR); Jong Sun Park, Suwon-si (KR)

(73) Assignee: KT&G CORPORATION, Daejeon (KR)

( * ) Notice: Subject to any disclaimer, the term of this patent is extended or adjusted under 35 U.S.C. 154(b) by 393 days.

(21) Appl. No.: 16/759,441

(22) PCT Filed: Oct. 26, 2018

(86) PCT No.: PCT/KR2018/012807
§ 371 (c)(1),
(2) Date: Apr. 27, 2020

(87) PCT Pub. No.: WO2019/088586
PCT Pub. Date: May 9, 2019

(65) Prior Publication Data
US 2020/0329772 A1    Oct. 22, 2020

(30) Foreign Application Priority Data

Oct. 30, 2017 (KR) .................. 10-2017-0142578
May 30, 2018 (KR) .................. 10-2018-0062137

(51) Int. Cl.
*A24F 40/30* (2020.01)
*A24B 15/167* (2020.01)
(Continued)

(52) U.S. Cl.
CPC ............ *A24F 40/30* (2020.01); *A24B 15/167* (2016.11); *A24D 1/20* (2020.01); *A24D 3/17* (2020.01);
(Continued)

(58) Field of Classification Search
CPC .......... A24F 40/42; A24F 40/65; A24F 40/90; A24F 15/01; A24F 40/485; A24F 40/10;
(Continued)

(56) References Cited

U.S. PATENT DOCUMENTS 3,886,954 A * 6/1975 Hannema ................ A24F 13/16
131/175
5,348,027 A 9/1994 Barnes et al.
(Continued)

FOREIGN PATENT DOCUMENTS

CA    2 778 903 A1    5/2011
CA    2 970 045 A1    6/2016
(Continued)

OTHER PUBLICATIONS

English language machine translation of WO-2016138689-A1 (Year: 2022).*
(Continued)

*Primary Examiner* — Russell E Sparks
(74) *Attorney, Agent, or Firm* — Sughrue Mion, PLLC

(57) ABSTRACT

According to an exemplary embodiment, provided is an aerosol generating device including a body portion comprising a vaporizer configured to generate aerosol by heating a liquid composition; and one or more air flow paths configured to cause the generated aerosol to pass through a cigarette and be discharged to outside; and a cover coupled to the body portion and comprising a plurality of passages comprising a first passage and a second passage which are independent from each other and guide air to an entrance of the vaporizer along at least part of a surface of the body portion.

15 Claims, 10 Drawing Sheets

(51) Int. Cl.

| | | |
|---|---|---|
| *A24D 1/20* | (2020.01) | |
| *A24D 3/17* | (2020.01) | |
| *A24F 15/01* | (2020.01) | |
| *A24F 40/40* | (2020.01) | |
| *A24F 40/42* | (2020.01) | |
| *A24F 40/44* | (2020.01) | |
| *A24F 40/46* | (2020.01) | |
| *A24F 40/485* | (2020.01) | |
| *A24F 40/50* | (2020.01) | |
| *A24F 40/57* | (2020.01) | |
| *A24F 40/60* | (2020.01) | |
| *A24F 40/65* | (2020.01) | |
| *A24F 40/90* | (2020.01) | |
| *A24F 40/95* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *H05K 1/02* | (2006.01) | |
| *H05K 1/14* | (2006.01) | |
| *H05K 1/18* | (2006.01) | |
| *A24F 40/10* | (2020.01) | |
| *A24F 40/20* | (2020.01) | |
| *A24F 40/51* | (2020.01) | |
| *F21Y 115/10* | (2016.01) | |

(52) U.S. Cl.
CPC .............. *A24F 15/01* (2020.01); *A24F 40/40* (2020.01); *A24F 40/42* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/10* (2020.01); *A24F 40/20* (2020.01); *A24F 40/51* (2020.01); *F21Y 2115/10* (2016.08); *H05K 2201/012* (2013.01); *H05K 2201/0154* (2013.01); *H05K 2201/10219* (2013.01)

(58) Field of Classification Search
CPC .......... A24F 40/46; A24F 40/95; A24F 40/40; A24F 40/44; A24F 40/20; A24F 40/57; A24F 40/30; A24F 40/50; A24F 40/60; A24B 15/167; A24D 3/17; A24D 1/20
See application file for complete search history.

(56) References Cited

U.S. PATENT DOCUMENTS

| | | |
|---|---|---|
| 5,388,594 A | 2/1995 | Counts et al. |
| 5,408,574 A | 4/1995 | Deevi et al. |
| 5,505,214 A | 4/1996 | Collins et al. |
| 5,555,476 A | 9/1996 | Suzuki et al. |
| 5,665,262 A | 9/1997 | Hajaligol et al. |
| 5,692,525 A | 12/1997 | Counts et al. |
| 5,723,228 A | 3/1998 | Okamoto |
| 5,750,964 A | 5/1998 | Counts et al. |
| 5,878,752 A | 3/1999 | Adams et al. |
| 5,902,501 A | 5/1999 | Nunnally et al. |
| 5,934,289 A | 8/1999 | Watkins et al. |
| 5,949,346 A | 9/1999 | Suzuki et al. |
| 5,970,719 A | 10/1999 | Merritt |
| 6,026,820 A | 2/2000 | Baggett, Jr. et al. |
| 6,615,840 B1 | 9/2003 | Fournier et al. |
| 6,803,550 B2 | 10/2004 | Sharpe et al. |
| 6,810,883 B2 | 11/2004 | Felter et al. |
| 7,082,825 B2 | 8/2006 | Aoshima et al. |
| 7,594,945 B2 | 9/2009 | Kim et al. |
| 7,682,571 B2 | 3/2010 | Kim et al. |
| 7,726,320 B2 | 6/2010 | Robinson et al. |
| 8,205,622 B2 | 6/2012 | Pan |
| 8,558,147 B2 | 10/2013 | Greim et al. |
| 8,602,037 B2 | 12/2013 | Inagaki |
| 8,689,804 B2 | 4/2014 | Fernando et al. |
| 8,833,364 B2 | 9/2014 | Buchberger |
| 8,997,754 B2 | 4/2015 | Tucker et al. |
| 9,084,440 B2 | 7/2015 | Zuber et al. |
| 9,165,484 B2 | 10/2015 | Choi |
| 9,295,286 B2 | 3/2016 | Shin |
| 9,347,644 B2 | 5/2016 | Araki et al. |
| 9,402,422 B2 * | 8/2016 | Shenkal .................... H05B 3/40 |
| 9,405,148 B2 | 8/2016 | Chang et al. |
| 9,420,829 B2 | 8/2016 | Thorens et al. |
| 9,516,899 B2 | 12/2016 | Plojoux et al. |
| 9,532,600 B2 | 1/2017 | Thorens et al. |
| 9,541,820 B2 | 1/2017 | Ogawa |
| 9,693,587 B2 | 7/2017 | Plojoux et al. |
| 9,713,345 B2 | 7/2017 | Farine et al. |
| 9,814,269 B2 | 11/2017 | Li et al. |
| 9,839,238 B2 | 12/2017 | Worm et al. |
| 9,844,234 B2 | 12/2017 | Thorens et al. |
| 9,848,651 B2 | 12/2017 | Wu |
| 9,854,845 B2 | 1/2018 | Plojoux et al. |
| 9,888,727 B2 | 2/2018 | Li et al. |
| 9,949,507 B2 | 4/2018 | Flick |
| 9,974,117 B2 | 5/2018 | Qiu |
| 10,070,667 B2 | 9/2018 | Lord et al. |
| 10,104,909 B2 | 10/2018 | Han et al. |
| 10,104,911 B2 | 10/2018 | Thorens et al. |
| 10,111,469 B2 * | 10/2018 | Zhu ...................... A24F 40/485 |
| 10,136,673 B2 | 11/2018 | Mironov |
| 10,136,675 B2 | 11/2018 | Li et al. |
| 10,143,232 B2 | 12/2018 | Talon |
| 10,238,149 B2 | 3/2019 | Hon |
| 10,251,428 B2 * | 4/2019 | Lin .................... A61M 15/0066 |
| 10,390,564 B2 | 8/2019 | Fernando et al. |
| 10,412,994 B2 | 9/2019 | Schennum et al. |
| 10,426,193 B2 | 10/2019 | Schennum et al. |
| 10,548,350 B2 | 2/2020 | Greim et al. |
| 10,555,555 B2 | 2/2020 | Fernando et al. |
| 10,602,778 B2 | 3/2020 | Hu et al. |
| 10,617,149 B2 | 4/2020 | Malgat et al. |
| 10,694,783 B2 | 6/2020 | Jochnowitz |
| 10,701,973 B2 | 7/2020 | Lee |
| 10,757,975 B2 | 9/2020 | Batista et al. |
| 10,842,194 B2 | 11/2020 | Batista et al. |
| 10,905,165 B2 * | 2/2021 | Kane ........................ A24F 40/42 |
| 10,973,087 B2 | 4/2021 | Wang et al. |
| 11,051,545 B2 | 7/2021 | Batista et al. |
| 11,051,550 B2 | 7/2021 | Lin et al. |
| 11,147,316 B2 | 10/2021 | Farine et al. |
| 11,589,617 B2 * | 2/2023 | Yilmaz .................... A24F 40/50 |
| 11,596,751 B2 * | 3/2023 | Potter ...................... A24F 40/42 |
| 11,865,246 B2 * | 1/2024 | Hepworth ............. A61M 15/06 |
| 2003/0226837 A1 | 12/2003 | Blake et al. |
| 2004/0089314 A1 | 5/2004 | Felter et al. |
| 2004/0149737 A1 | 8/2004 | Sharpe et al. |
| 2005/0142036 A1 | 6/2005 | Kim et al. |
| 2005/0172976 A1 | 8/2005 | Newman et al. |
| 2006/0267614 A1 | 11/2006 | Lee et al. |
| 2007/0007266 A1 | 1/2007 | Sasaki et al. |
| 2007/0074734 A1 | 4/2007 | Braunshteyn et al. |
| 2007/0102013 A1 | 5/2007 | Adams et al. |
| 2007/0246382 A1 | 10/2007 | He |
| 2007/0267031 A1 | 11/2007 | Hon |
| 2008/0092912 A1 | 4/2008 | Robinson et al. |
| 2010/0074616 A1 | 3/2010 | Kewitsch |
| 2010/0313901 A1 | 12/2010 | Fernando et al. |
| 2011/0155718 A1 | 6/2011 | Greim et al. |
| 2011/0226236 A1 | 9/2011 | Buchberger |
| 2011/0234069 A1 | 9/2011 | Chen et al. |
| 2013/0014772 A1 | 1/2013 | Liu |

(56) References Cited

U.S. PATENT DOCUMENTS

| | | |
|---|---|---|
| 2013/0220466 A1 | 8/2013 | Zandiyeh et al. |
| 2013/0228191 A1 | 9/2013 | Newton |
| 2013/0255675 A1 | 10/2013 | Liu |
| 2013/0319999 A1 | 12/2013 | Plojoux et al. |
| 2014/0060554 A1 | 3/2014 | Collett et al. |
| 2014/0069424 A1 | 3/2014 | Poston et al. |
| 2014/0209105 A1 | 7/2014 | Sears et al. |
| 2014/0217085 A1 | 8/2014 | Alima |
| 2014/0261487 A1 | 9/2014 | Chapman et al. |
| 2014/0286630 A1 | 9/2014 | Buchberger |
| 2014/0338686 A1 | 11/2014 | Plojoux et al. |
| 2014/0339509 A1 | 11/2014 | Choi et al. |
| 2014/0345633 A1 | 11/2014 | Talon et al. |
| 2014/0353856 A1 | 12/2014 | Dubief |
| 2015/0020831 A1 | 1/2015 | Weigensberg et al. |
| 2015/0163859 A1 | 6/2015 | Schneider et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0331030 A1 | 11/2016 | Ampolini et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0049155 A1 | 2/2017 | Liu |
| 2017/0055589 A1 | 3/2017 | Fernando et al. |
| 2017/0071251 A1 | 3/2017 | Goch |
| 2017/0105454 A1 | 4/2017 | Li et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0303598 A1 | 10/2017 | Li et al. |
| 2017/0318860 A1 | 11/2017 | Adair |
| 2017/0325505 A1 | 11/2017 | Force et al. |
| 2017/0347715 A1 | 12/2017 | Mironov et al. |
| 2017/0360104 A1 | 12/2017 | Hu et al. |
| 2018/0027878 A1 | 2/2018 | Dendy et al. |
| 2018/0028993 A1 | 2/2018 | Dubief |
| 2018/0049471 A1 | 2/2018 | Holoubek et al. |
| 2018/0160733 A1 | 6/2018 | Leadley et al. |
| 2018/0199630 A1 | 7/2018 | Qiu |
| 2019/0059448 A1 | 2/2019 | Talon |
| 2019/0159524 A1 | 5/2019 | Qiu |
| 2019/0254344 A1* | 8/2019 | Hepworth ............ A61M 15/06 |
| 2019/0261688 A1* | 8/2019 | Qiu ..................... A24F 40/46 |
| 2019/0281896 A1 | 9/2019 | Chapman et al. |
| 2019/0357590 A1* | 11/2019 | Sutton ................. A24F 40/30 |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0261000 A1 | 8/2020 | Kim et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |
| 2021/0146067 A1 | 5/2021 | Buchberger |

FOREIGN PATENT DOCUMENTS

| | | | |
|---|---|---|---|
| CA | 2966828 A1 * | 6/2016 | ............ A24F 40/10 |
| CA | 2 989 260 A1 | 12/2016 | |
| CN | 1078621 A | 11/1993 | |
| CN | 1126425 A | 7/1996 | |
| CN | 1162425 A | 7/1996 | |
| CN | 1190335 A | 8/1998 | |
| CN | 1280661 A | 1/2001 | |
| CN | 1491598 A | 4/2004 | |
| CN | 1633247 A | 6/2005 | |
| CN | 1871987 A | 12/2006 | |
| CN | 101277622 A | 10/2008 | |
| CN | 101277623 A | 10/2008 | |
| CN | 101301963 A | 11/2008 | |
| CN | 101324490 A | 12/2008 | |
| CN | 201253138 Y | 6/2009 | |
| CN | 101518361 A | 9/2009 | |
| CN | 201314692 Y | 9/2009 | |
| CN | 101557728 A | 10/2009 | |
| CN | 101637308 A | 2/2010 | |
| CN | 201657047 U | 11/2010 | |
| CN | 201996322 U | 10/2011 | |
| CN | 102264251 A | 11/2011 | |
| CN | 102595943 A | 7/2012 | |
| CN | 202385727 U | 8/2012 | |
| CN | 102665459 A | 9/2012 | |
| CN | 202854031 U | 4/2013 | |
| CN | 103099319 A | 5/2013 | |
| CN | 202907797 U | 5/2013 | |
| CN | 203040065 U | 7/2013 | |
| CN | 103271447 A | 9/2013 | |
| CN | 103477252 A | 12/2013 | |
| CN | 103519351 A | 1/2014 | |
| CN | 103653257 A | 3/2014 | |
| CN | 103653258 A | 3/2014 | |
| CN | 203492793 U | 3/2014 | |
| CN | 103720056 A | 4/2014 | |
| CN | 103889258 A | 6/2014 | |
| CN | 103974635 A | 8/2014 | |
| CN | 103974638 A | 8/2014 | |
| CN | 103974640 A | 8/2014 | |
| CN | 103997922 A | 8/2014 | |
| CN | 104135879 A | 11/2014 | |
| CN | 104146353 A | 11/2014 | |
| CN | 104188110 A | 12/2014 | |
| CN | 104219973 A | 12/2014 | |
| CN | 204120226 U | 1/2015 | |
| CN | 2041 46340 U | 2/2015 | |
| CN | 204132401 U | 2/2015 | |
| CN | 104423130 A | 3/2015 | |
| CN | 204317492 U | 5/2015 | |
| CN | 204317502 U | 5/2015 | |
| CN | 204393344 U | 6/2015 | |
| CN | 204483007 U | 7/2015 | |
| CN | 104886776 A | 9/2015 | |
| CN | 105188430 A | 12/2015 | |
| CN | 204838003 U | 12/2015 | |
| CN | 105326092 A | 2/2016 | |
| CN | 205072064 U | 3/2016 | |
| CN | 205180371 U | 4/2016 | |
| CN | 205214209 U | 5/2016 | |
| CN | 105722416 A | 6/2016 | |
| CN | 205358219 U | 7/2016 | |
| CN | 205358225 U | 7/2016 | |
| CN | 105852221 A | 8/2016 | |
| CN | 105852225 A | 8/2016 | |
| CN | 205456064 U | 8/2016 | |
| CN | 105919162 A | 9/2016 | |
| CN | 205624474 U | 10/2016 | |
| CN | 106136331 A | 11/2016 | |
| CN | 106163304 A | 11/2016 | |
| CN | 106170215 A | 11/2016 | |
| CN | 205671480 U | 11/2016 | |
| CN | 106231934 A | 12/2016 | |
| CN | 106235419 A | 12/2016 | |
| CN | 205831079 U | 12/2016 | |
| CN | 106418702 A | 2/2017 | |
| CN | 106418729 A | 2/2017 | |

(56) References Cited

FOREIGN PATENT DOCUMENTS

| | | |
|---|---|---|
| CN | 106473232 A | 3/2017 |
| CN | 106473233 A | 3/2017 |
| CN | 106490686 A | 3/2017 |
| CN | 106535680 A | 3/2017 |
| CN | 106690427 A | 5/2017 |
| CN | 106723379 A | 5/2017 |
| CN | 106793834 A | 5/2017 |
| CN | 206197012 U | 5/2017 |
| CN | 106912985 A | 7/2017 |
| CN | 206314585 U | 7/2017 |
| CN | 106998816 A | 8/2017 |
| CN | 107105772 A | 8/2017 |
| CN | 206442590 U | 8/2017 |
| CN | 206443202 U | 8/2017 |
| CN | 206443214 U | 8/2017 |
| CN | 107156909 A * | 9/2017 ........... A24F 47/008 |
| CN | 107173850 A | 9/2017 |
| CN | 107183789 A | 9/2017 |
| CN | 107205491 A | 9/2017 |
| CN | 206462413 U | 9/2017 |
| CN | 206525558 U * | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2 316 286 A1 | 5/2011 |
| EP | 2 327 318 A1 | 6/2011 |
| EP | 2 340 729 A1 | 7/2011 |
| EP | 2368449 A1 | 9/2011 |
| EP | 2 677 273 A1 | 12/2013 |
| EP | 2 921 065 A1 | 9/2015 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2 301 894 A | 12/1996 |
| GB | 2514893 A | 12/2014 |
| JP | 48-63677 U | 8/1973 |
| JP | 62-15793 A | 1/1987 |
| JP | 63-68690 U | 5/1988 |
| JP | 6-73784 U | 10/1994 |
| JP | 7-72809 A | 3/1995 |
| JP | 7-184627 A | 7/1995 |
| JP | 8-122942 A | 5/1996 |
| JP | 9-75058 A | 3/1997 |
| JP | 9-161822 A | 6/1997 |
| JP | 9-228919 A | 9/1997 |
| JP | 10-37781 A | 2/1998 |
| JP | 2001-200495 A | 7/2001 |
| JP | 2002-514910 A | 5/2002 |
| JP | 2003-527127 A | 9/2003 |
| JP | 2004-212102 A | 7/2004 |
| JP | 2005-199913 A | 7/2005 |
| JP | 2006-252897 A | 9/2006 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014132560 A | 7/2014 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 101087458 B1 | 11/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0044165 A | 4/2014 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-2016-0131035 A | 11/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0057535 A | 5/2017 |
| KR | 10-1733448 B1 | 5/2017 |
| KR | 10-2017-0067171 A | 6/2017 |
| KR | 10-2017-0083596 A | 7/2017 |
| KR | 1020170076703 A | 7/2017 |
| KR | 10-2017-0117444 A | 10/2017 |
| KR | 10-2017-0118233 A | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |

(56) References Cited

FOREIGN PATENT DOCUMENTS

| | | |
|---|---|---|
| RU | 2611487 C2 | 2/2017 |
| RU | 2617297 C2 | 4/2017 |
| RU | 2 619 735 C1 | 5/2017 |
| RU | 2015152134 A | 6/2017 |
| TW | 201330884 A | 8/2013 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/102092 A1 | 7/2014 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/117702 A1 | 8/2015 |
| WO | 2015/150759 A1 | 10/2015 |
| WO | 2015/168828 A1 | 11/2015 |
| WO | 2015/174657 A1 | 11/2015 |
| WO | 2015/177046 A1 | 11/2015 |
| WO | 2015/189388 A1 | 12/2015 |
| WO | 2016/005601 A1 | 1/2016 |
| WO | 2016/009202 A1 | 1/2016 |
| WO | 2016/012795 A1 | 1/2016 |
| WO | 2016/062777 A1 | 4/2016 |
| WO | 2016/096337 A1 | 6/2016 |
| WO | 2016091658 A1 | 6/2016 |
| WO | WO-2016096780 A1 * 6/2016 ........... A24B 15/167 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | WO-2016138689 A1 * 9/2016 ............. A24F 13/00 |
| WO | 2016/184978 A1 | 11/2016 |
| WO | 2016/199065 A1 | 12/2016 |
| WO | 2016/199066 A1 | 12/2016 |
| WO | 2016/207407 A1 | 12/2016 |
| WO | 2017/001520 A1 | 1/2017 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |
| WO | WO-2020053388 A1 * 3/2020 ............. A24F 40/10 |

OTHER PUBLICATIONS

English language machine translation of CN-206525558-U (Year: 2022).*
English language machine translation of CN-107156909-A (Year: 2022).*
Office Action issued Aug. 12, 2019 in Korean Application No. 10-2019-0033722.
Office Action issued Jul. 2, 2019 in Korean Application No. 10-2019-0017392.
Office Action issued Jul. 3, 2019 in Korean Application No. 10-2019-0016835.
Office Action issued May 18, 2019 in Korean Application No. 10-2018-0090063.
Office Action issued Oct. 25, 2019 in Korean Application No. 10-2018-0078296.
Office Action issued Oct. 15, 2019 in Korean Application No. 10-2018-0074188.
Office Action issued Oct. 8, 2019 in Korean Application No. 10-2018-0072992.
Office Action issued Oct. 8, 2019 in Korean Application No. 10-2018-0072935.
Office Action issued Sep. 6, 2019 in Korean Application No. 10-2018-0069645.
Office Action issued Jul. 10, 2019 in Korean Application No. 10-2018-0064487.
Office Action issued Jun. 24, 2019 in Korean Application No. 10-2018-0062137.
Office Action issued Jun. 19, 2019 in Korean Application No. 10-2018-0059580.
Office Action issued May 13, 2019 in Korean Application No. 10-2018-0058596.
Office Action issued May 3, 2019 in Korean Application No. 10-2018-0055120.
Office Action issued Dec. 9, 2019 in Korean Application No. 10-2018-0052133.
Office Action issued Dec. 9, 2019 in Korean Application No. 10-2018-0051469.
Office Action issued Dec. 9, 2019 in Korean Application No. 10-2018-0051467.
International Search Report issued Apr. 16, 2019 in International Application No. PCT/KR2018/012899.
International Search Report issued Apr. 26, 2019 in International Application No. PCT/KR2018/012895.
International Search Report issued May 17, 2019 in International Application No. PCT/KR2018/012810.
International Search Report issued May 17, 2019 in International Application No. PCT/KR2018/012809.
International Search Report issued May 17, 2019 in International Application No. PCT/KR2018/012808.
International Search Report issued May 3, 2019 in International Application No. PCT/KR2018/012807.
International Search Report issued May 17, 2019 in International Application No. PCT/KR2018/012776.
International Search Report issued Apr. 3, 2019 in International Application No. PCT/KR2018/012775.
International Search Report issued Apr. 3, 2019 in International Application No. PCT/KR2018/012774.
International Search Report issued Apr. 3, 2019 in International Application No. PCT/KR2018/012773.
International Search Report issued May 20, 2019 in International Application No. PCT/KR2018/012685.
International Search Report issued May 21, 2019 in International Application No. PCT/KR2018/012676.
International Search Report issued Nov. 26, 2018 in International Application No. PCT/KR2018/005767.
International Search Report issued Aug. 28, 2018 in International Application No. PCT/KR2018/005693.
International Search Report issued Nov. 2, 2018 in International Application No. PCT/KR2018/005306.
Communication issued Feb. 24, 2021 by the Japanese Patent Office in application No. 2020-503962.
Communication Mar. 23, 2021 by the Japanese Patent Office in application No. 2020-522897.
Communication issued Mar. 2, 2021 by the Japanese Patent Office in application No. 2020-523669.
Communication issued Mar. 30, 2021 by the Japanese Patent Office in application No. 2020-501446.
Communication issued Mar. 16, 2021 by the Japanese Patent Office in application No. 2020-521441.
Communication issued Feb. 9, 2021 by the Japanese Patent Office in application No. 2020-501205.
Communication issued Mar. 16, 2021 by the European Patent Office in application No. 18806877.9.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.

(56) References Cited

OTHER PUBLICATIONS

Communication dated Dec. 2, 2021 from the Chinese Patent Office in Chinese Application No. 201880048444.9.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Communication issued Jul. 27, 2020 by the Russian Patent Office in application No. 2020110821.
Communication issued Jun. 11, 2020 by the Korean Patent Office in application No. 10-2018-0051469.
Office Action issued Apr. 5, 2019 in Korean Application No. 10-2019-0017393.
Office Action issued Apr. 25, 2019 in Korean Application No. 10-2019-0033722.
Office Action issued Apr. 25, 2019 in Korean Application No. 10-2019-0033723.
Office Action issued Jun. 7, 2021 in Canadian Application No. 3,076,886.
Office Action issued Feb. 9, 2018 in Korean Application No. 10-2017-0058786.
Office Action issued Jan. 24, 2022 in Chinese Application No. 201880030661.5.
Office Action issued Dec. 24, 2021 in Chinese Application No. 201880055847.6.
Office Action issued Dec. 20, 2021 in Chinese Application No. 201880048655.2.
Office Action issued Jan. 4, 2022 in Chinese Application No. 201880048703.8.
Office Action issued Jan. 18, 2022 in Chinese Application No. 201880052857.4.
Office Action issued Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action issued Dec. 31, 2021 in Chinese Application No. 201880049189.X.
Extended European Search Report issued Jan. 15, 2021 in European Application No. 18799246.6.
Office Action issued May 25, 2020 in Russian Application No. 2019135871.
Office Action issued Jun. 10, 2020 in Korean Application No. 10-2018-0052137.
Office Action issued Oct. 5, 2020 in Korean Application No. 10-2020-0090577.
Office Action issued Oct. 16, 2020 in Korean Application No. 10-2020-0092553.
Extended European Search Report issued Nov. 16, 2020 in European Application No. 20189002.7.
Office Action issued Dec. 8, 2020 in Russian Application No. 2020113632.
Office Action issued Nov. 25, 2020 in Russian Application No. 2020124810.
Office Action issued Jan. 26, 2021 in Japanese Application No. 2020-502671.
Office Action issued Dec. 22, 2020 in Japanese Application No. 2020-502181.
Office Action issued Dec. 22, 2020 in Japanese Application No. 2020-503856.
Extended European Search Report issued Nov. 13, 2020 in European Application No. 20188970.6.
Office Action issued Nov. 10, 2020 in Japanese Application No. 2020-523671.
Office Action issued Nov. 24, 2020 in Russian Application No. 2020124811.
Extended European Search Report issued Sep. 9, 2021 in European Application No. 18873562.5.
Office Action issued Aug. 3, 2021 in Japanese Application No. 2020-503856 English.
Extended European Search Report issued Aug. 18, 2021 in European Application No. 18874344.7.
Extended European Search Report issued Jul. 30, 2021 in European Application No. 18874446.0.
Extended European Search Report issued Aug. 17, 2021 in European Application No. 18872432.2.
Office Action issued Aug. 17, 2021 in Japanese Application No. 2020-503962.
Extended European Search Report dated Aug. 10, 2021 in European Application No. 18873846.2.
Extended European Search Report issued Aug. 17, 2021 in European Application No. 18873943.7.
Extended European Search Report issued Aug. 10, 2021 in European Application No. 18874742.2.
Extended European Search Report issued Aug. 12, 2021 in European Application No. 18874837.0.
Extended European Search Report issued Aug. 20, 2021 in European Application No. 18874962.6.
Extended European Search Report issued Aug. 6, 2021 in European Application No. 18872527.9.
Extended European Search Report issued Sep. 2, 2021 in European Application No. 18874839.6.
Extended European Search Report issued Jul. 20, 2021 in European Application No. 18872006.4.
Office Action issued Sep. 3, 2021 in Chinese Application No. 201880035480.1.
Office Action issued Aug. 11, 2021 in Chinese Application No. 201880029050.9.
Office Action issued Aug. 26, 2022 in Chinese Application No. 201880048703.8.
Office Action issued Jul. 12, 2022 in Chinese Application No. 201880049189.X.
Office Action issued Jul. 4, 2022 in Chinese Application No. 201880048657.1.
Office Action issued Jun. 22, 2022 in Chinese Application No. 201880048444.9.
Office Action issued Jun. 28, 2022 in Japanese Application No. 2020-522897.
Su Zuen et al., "Heat Transfer", Dalian Maritime University Press, Feb. 28, 1989, pp. 12-13 (9 pages total).
Japanese Office Action dated Nov. 1, 2022 in Japanese Application No. 2020-501205.
Chinese Office Action dated Dec. 29, 2022 in Chinese Application No. 201880055847.6.
Japanese Office Action dated Dec. 20, 2022 in Japanese Application No. 2021-122551.
Japanese Office Action dated Jan. 10, 2023 in Japanese Application No. 2021-080578.
Chinese Office Action dated Mar. 30, 2023 in Chinese Application No. 201880030661.5.
Chinese Office Action dated May 12, 2023 in Chinese Application No. 201880048703.8.
Jia Wei-Ping et al., "Determination of Aerosol Concentration in Mainstream Cigarette Smoke Based on Online Impact", Tobacco Science and Technology, Dec. 2010, vol. 281, (4 pages total).
Office Action dated Jan. 20, 2023 from the China National Intellectual Property Administration in CN Application No. 202010761215.0.
Office Action dated Jan. 28, 2023 from the China National Intellectual Property Administration in CN Application No. 202010761219.9.
Office Action dated Feb. 14, 2023 from the Japanese Patent Office in JP Application No. 2022-074915.
Extended European Search Report dated Dec. 12, 2023 in European Application No. 23210344.0.
Chinese Office Action dated Feb. 23, 2024 in Chinese Application No. 202010761215.0.

(56) References Cited

OTHER PUBLICATIONS

Communication issued Nov. 6, 2024 in European Patent Application No. 18874742.2.
Communication dated Jan. 13, 2025 in European Application No. 18 873 562.5.
Chinese Office Action dated Jan. 3, 2025 in Application No. 202211279469.4.
Extended European Search Report dated Mar. 3, 2025 in Application No. 24213663.8.

* cited by examiner

AEROSOL GENERATING DEVICE

TECHNICAL FIELD

The present disclosure relates to an aerosol generating device, and more particularly, to an aerosol generating device capable of generating an aerosol having various flavors by passing an aerosol generated by a vaporizer through a cigarette.

BACKGROUND ART

Recently, the demand for alternative methods to overcome the shortcomings of general cigarettes has increased. For example, there is an increasing demand for a method of generating aerosol by heating an aerosol generating material in cigarettes, rather than by burning cigarettes. Accordingly, studies on a heating-type cigarette and a heating-type aerosol generating device have been actively conducted.

Meanwhile, to provide a user with an improved smoking experience, an aerosol generating device that uses a liquid composition as an aerosol generating source with a cigarette has been developed. For example, there has been developed an aerosol generating device which includes a vaporizer for heating a liquid composition to generate an aerosol and allows the aerosol generated by the vaporizer to pass through the cigarette and be delivered to the user. However, in such an aerosol generating device air introduced into the aerosol generating device needs to pass through not only the cigarette but also the vaporizer to be delivered to the user. As a result, the air flow path may increase or may be more complex as compared to the related art. In this case, if the number of air inlets is maintained to be the same as in the related art, the performance of the aerosol generating device may be degraded because of unsmooth air flow in the aerosol generating device. Accordingly, technology for facilitating air flow in the aerosol generating device may be required.

DESCRIPTION OF EMBODIMENTS

Solution to Problem

Provided are an aerosol generating device. The technical solution of the present disclosure is not limited to the above-described technical problems, and other technical problems may be deduced from the following embodiments. For example, an aerosol generating device may include a body portion comprising a vaporizer configured to heat a liquid composition to generate an aerosol and one or more air flow paths for causing the generated aerosol to pass through a cigarette and discharged to the outside, and a cover coupled to the body portion and comprising a plurality of passages comprising a first passage and a second passage which are independent from each other and guide air to an entrance of the vaporizer along at least a part of the surface of the body portion.

Advantageous Effects of Disclosure

The present disclosure may provide an aerosol generating device including a cover coupled to a body portion. Specifically, the aerosol generating device according to the present disclosure may include a body portion comprising a vaporizer for heating a liquid composition to generate an aerosol and one or more air flow paths for causing the generated aerosol to pass through a cigarette and discharged to the outside, and a cover coupled to the body portion and comprising a plurality of independent passages that guide air to an entrance of the vaporizer along at least a part of the surface of the body portion.

According to the present disclosure, the plurality of passages through which air is introduced into the vaporizer included in the aerosol generating device are formed, thereby achieving a smooth air flow in the aerosol generating device, and effectively preventing the performance degradation of the aerosol generating device.

BEST MODE

Figure 1:
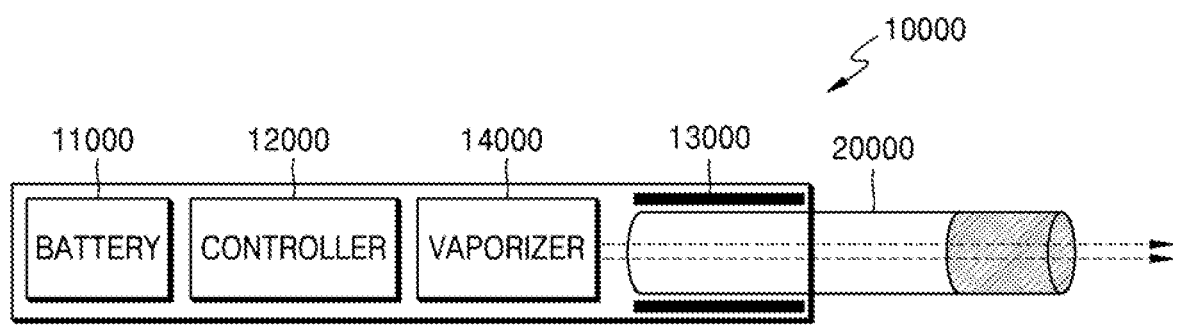
FIGS. 1 and 2 are diagrams showing examples in which a cigarette is inserted into an aerosol generating device.

According to an aspect of the present disclosure, an aerosol generating device may include a body portion comprising a vaporizer configured to generate aerosol by heating a liquid composition; and one or more air flow paths configured to cause the generated aerosol to pass through a cigarette and be discharged to outside; and a cover coupled to the body portion and comprising a plurality of passages comprising a first passage and a second passage which are independent from each other and guide air to an entrance of the vaporizer along at least part of a surface of the body portion.

The cover may include an outer housing comprising a first through hole through which the cigarette penetrates and arranged to correspond to a receiving hole formed in the body portion into which the cigarette is inserted; a stopper configured to open or close the first through hole by sliding along an upper end of the outer housing; and an inner housing spaced apart from the outer housing to form a space such that the stopper slides inside the outer housing.

The inner housing may include a second through hole disposed coaxially with the first through hole, and the first passage may be formed between the inner housing and the body portion such that air that flows into a gap between the cigarette inserted into the receiving hole and the first through hole and passing through the second through hole flows along an upper surface of the body portion.

In an example, at least one of the outer housing and the inner housing may further include at least one support protrusion configured to maintain an interval between the inner housing and the body portion.

Meanwhile, the inner housing may further include a third through hole spaced apart from the second through hole, and the second passage may be formed between the outer housing and the inner housing to guide the air that flows into the gap between the cigarette inserted into the receiving hole and the first through hole to a side of the body portion.

A width of the first passage may be less than a width of the second passage.

The inner housing may further include a filter member disposed on the third through hole and configured to pass through air and filter foreign substances.

A cross-sectional shape of the third through hole may be at least one of a circle, a semicircle, an ellipse, and a polygon.

The third through hole may include a plurality of holes.

In an example the outer housing may further include an air inlet formed in a part where the outer housing and the body portion are connected when the outer housing is coupled to the body portion, and the cover may further include a third passage configured to guide air that flows into through the air inlet along at least a part of a surface of the body portion.

The air inlet may be formed to extend along at least a part of a circumference of the outer housing.

In another example, the outer housing may further include an air inlet formed to be spaced apart from a portion where the outer housing and the body portion are connected when the outer housing is coupled to the body portion, and the cover may further include a third passage configured to guide air that flows into through the air inlet along at least a part of a surface of the body portion.

Meanwhile, end portions of the plurality of passages may be connected to each other at an entrance of the vaporizer such that air that flows into through each of the plurality of passages is induced to the entrance of the vaporizer.

At least one of the outer housing and the inner housing may include a heat resistant material, and the heat resistant material may include a material capable of withstanding heat of 80° C. or more.

MODE OF DISCLOSURE

With respect to the terms in the various embodiments, the general terms which are currently and widely used are selected in consideration of functions of structural elements in the various embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er*", "-or", and "module" described in the specification mean units for processing at least one function and operation and can be implemented by hardware components or software components and combinations thereof.

Hereinafter, the present disclosure will now be described more fully with reference to the accompanying drawings, in which exemplary embodiments of the present disclosure are shown such that one of ordinary skill in the art may easily work the present disclosure. The disclosure can, however, be embodied in many different forms and should not be construed as being limited to the embodiments set forth herein.

Hereinafter, embodiments of the present disclosure will be described in detail with reference to the drawings.

Figure 2:
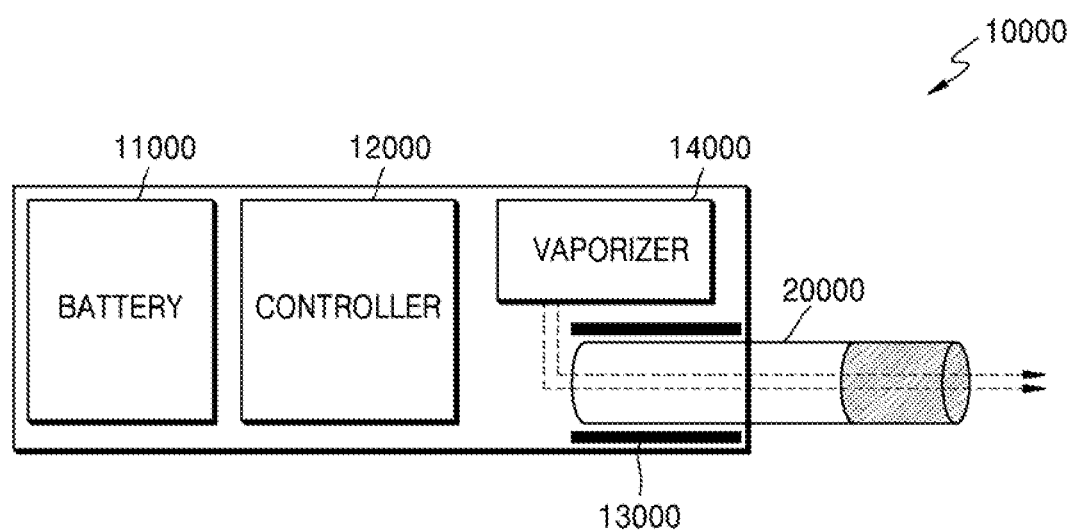

FIGS. 1 and 2 are diagrams showing examples in which a cigarette is inserted into an aerosol generating device.

Referring to FIGS. 1 and 2, an aerosol generating device 10000 includes a battery 11000, a controller 12000, a heater 13000, and a vaporizer 14000. Also, a cigarette 20000 may be inserted into an inner space of the aerosol generating device 10000.

FIGS. 1 and 2 only illustrate components of the aerosol generating device 10000, which are related to the present embodiment. Therefore, it will be understood by one of ordinary skill in the art that other general-purpose components may be further included in the aerosol generating device 10000, in addition to the components illustrated in FIG. 1.

Also, FIGS. 1 and 2 illustrate that the aerosol generating device 10000 includes the heater 13000. However, as necessary, the heater 13000 may be omitted.

FIG. 1 illustrates that the battery 11000, the controller 12000, the vaporizer 14000, and the heater 13000 are arranged in series. On the other hand, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be differently arranged.

When the cigarette 20000 is inserted into the aerosol generating device 10000, the aerosol generating device 10000 may operate the vaporizer 14000 to generate aerosol. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is in an operable state.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000 and increase a temperature of an aerosol generating material in the cigarette 20000.

The heater 13000 may include an electro-resistive heater. For example, the heater 13000 may include an electrically conductive track, and the heater 13000 may be heated when currents low through the electrically conductive track. However, the heater 13000 is not limited to the example described above and may include any other heaters which may be heated to a desired temperature. Here, the desired temperature may be pre-set in the aerosol generating device 10000 or may be set by a user.

As another example, the heater 13000 may include an induction heater. In detail, the heater 13000 may include an electrically conductive coil for heating a cigarette in an induction heating method, and the cigarette may include a susceptor which may be heated by the induction heater.

FIGS. 1 and 2 illustrate that the heater 13000 is positioned outside the cigarette 20000, but the position of the heater 13000 is not limited thereto. For example, the heater 13000 may include a tube-type heating element, a plate-type heating element, a needle-type heating element, or a rod-type heating element, and may heat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000, and the others may be arranged outside the cigarette 20000. In addition, the shape of the heater 13000 is not limited to the shapes Illustrated in FIGS. 1 and 2 and may include various shapes.

The vaporizer 14000 may generate aerosol by heating a liquid composition and the generated aerosol may pass through the cigarette 20000 to be delivered to a user. In other words, the aerosol generated by the vaporizer 14000 may move along an air flow passage of the aerosol generating device 10000. The air flow passage may be configured such that the aerosol generated by the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be attachable/detachable to/from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be wound around the liquid delivery element. The heating element may be heated by electrical current and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, a cradle may be used with the aerosol generating device 10000 to form a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, the first portion may be partially inserted into the aerosol generating device 10000. Otherwise, the first portion and a part of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and a smoking impression may be adjusted by the user. As another example, the external air may flow into the cigarette 20000 through at least one hole formed in a surface of the cigarette 20000.

Hereinafter, an example of the cigarette 20000 will be described with reference to FIG. 3.

Figure 3:
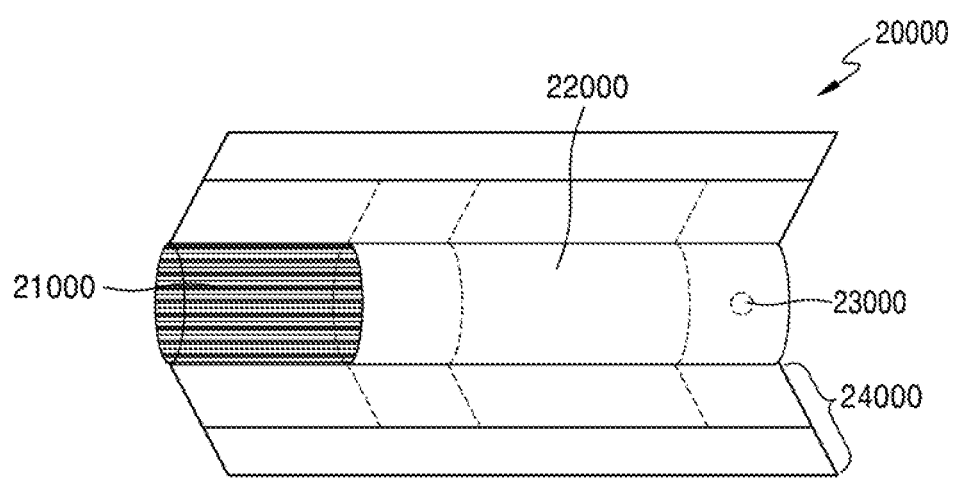
FIG. 3 is a drawing illustrating an example of a cigarette.

FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool aerosol and a second segment configured to filter a certain component included in the aerosol. Also, as necessary, the filter rod 22000 may further include at least one segment configured to perform other functions.

The cigarette 20000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged via separate wrappers, may be combined and packaged together using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers and coupled to each other, may be re-packaged using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat conductive material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a structure in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In an exemplary embodiment, the cooling segment may include a cellulose acetate filter having a plurality of holes. However, the cooling segment is not limited to the above-described example and any other cooling segment that cools the aerosol may be used.

Although not illustrated in FIG. 3, the cigarette 20000 according to an exemplary embodiment may further include a front-end filter. The front-end filter may be located on a front side of the tobacco rod 21000, the side away from the filter rod 22000. The front-end filter may prevent the tobacco rod 21000 from being detached and prevent liquefied aerosol from flowing into the aerosol generating device 10000 (FIGS. 1 and 2) from the tobacco rod 21000, during smoking.

Figure 4A:
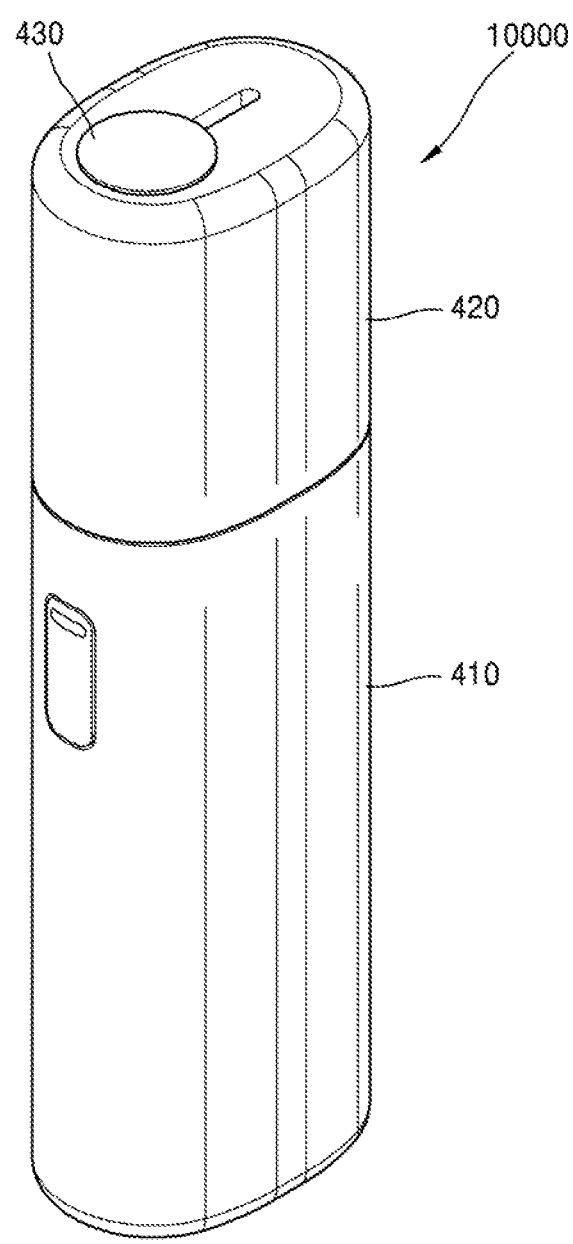
FIG. 4A is a perspective view of an aerosol generating device according to an exemplary embodiment.
Figure 4B:
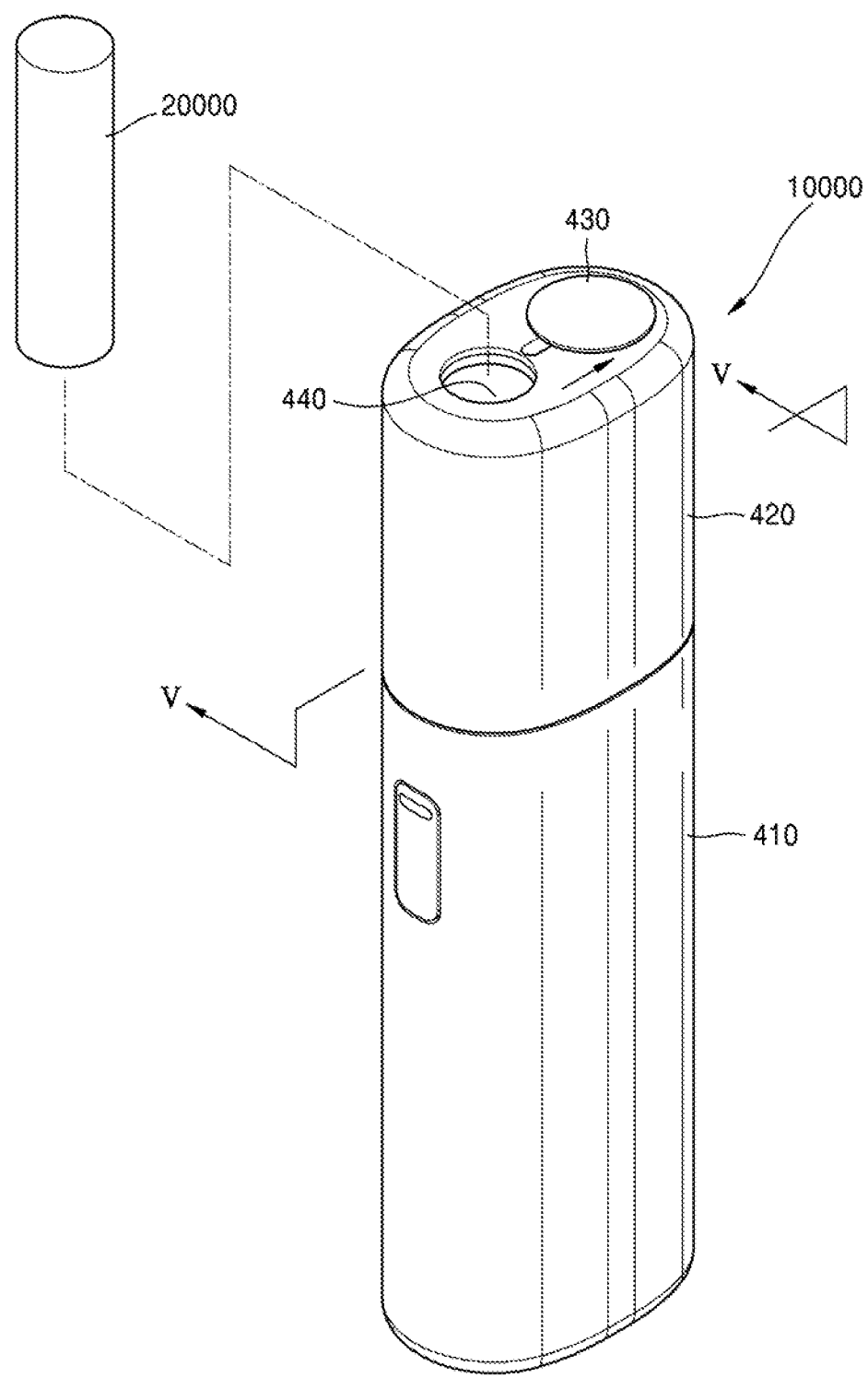
FIG. 4B is a perspective view showing an operating state of the aerosol generating device shown in FIG. 4A.

FIG. 4A is a perspective view of an aerosol generating device according to an exemplary embodiment, and FIG. 4B is a perspective view showing an operating state of the aerosol generating device shown in FIG. 4A.

Referring to FIGS. 4A and 4B, the aerosol generating device 10000 includes a body portion 410 into which a cigarette 20000 may be inserted. A cover 420 is coupled to the upper portion of the body portion 410. The cover 420 is coupled to the body portion 410 in a detachable manner. A stopper 430 is installed on the upper surface of the cover 420 in a slidable manner. However, the structure of the aerosol generating device 10000 shown in FIGS. 4A and 4B is only one example, and is not limited thereto. For example, the body portion 410 and the cover 420 may be an integral structure and not detachable from each other.

The upper surface of the cover 420 is provided with a rail extending along the sliding movement direction of the stopper 430, and a first through hole 440 into which the cigarette 20000 is inserted. The rail may expose the inside of the cover 420. However, the present disclosure is not limited thereto, and the rail may have a closed structure such that the outside and the inside of the cover 420 are not connected. In addition, the upper surface of the cover 420 may include any suitable structure, instead of the rail, that allows the sliding movement of the stopper 430.

The stopper 430 may open and close the first through hole 440 by sliding along the upper end of the cover 420. For example, when the stopper 430 moves along the rail formed on the upper surface of the cover 420 to a position shown in FIG. 4B, the first through hole 440 is exposed to the outside so that at least a part of the cigarette 20000 may be inserted into the first through hole 440.

Meanwhile, a method of coupling the stopper 430 to the cover 420 is not limited to the configuration of the exemplary embodiment shown in FIGS. 4A and 4B. For example, the stopper 430 may be coupled to the cover 420 by using a hinge coupling method such that the stopper 430 may open or dose the cover 420.

The body portion 410 may include a vaporizer 14000 for heating a liquid composition to generate aerosol as described with reference to FIGS. 1 and 2, and may include one or more air flows for causing the generated aerosol to pass through the cigarette 20000 and discharged to the outside.

The cover 420 may be coupled to the body portion 410 and may include a plurality of independent passages that guide air to an entrance of the vaporizer 14000 along at least a part of the surface of the body portion 410. Hereinafter, the plurality of passages provided in the cover 420 will be described in detail with reference to FIG. 5.

Figure 5:
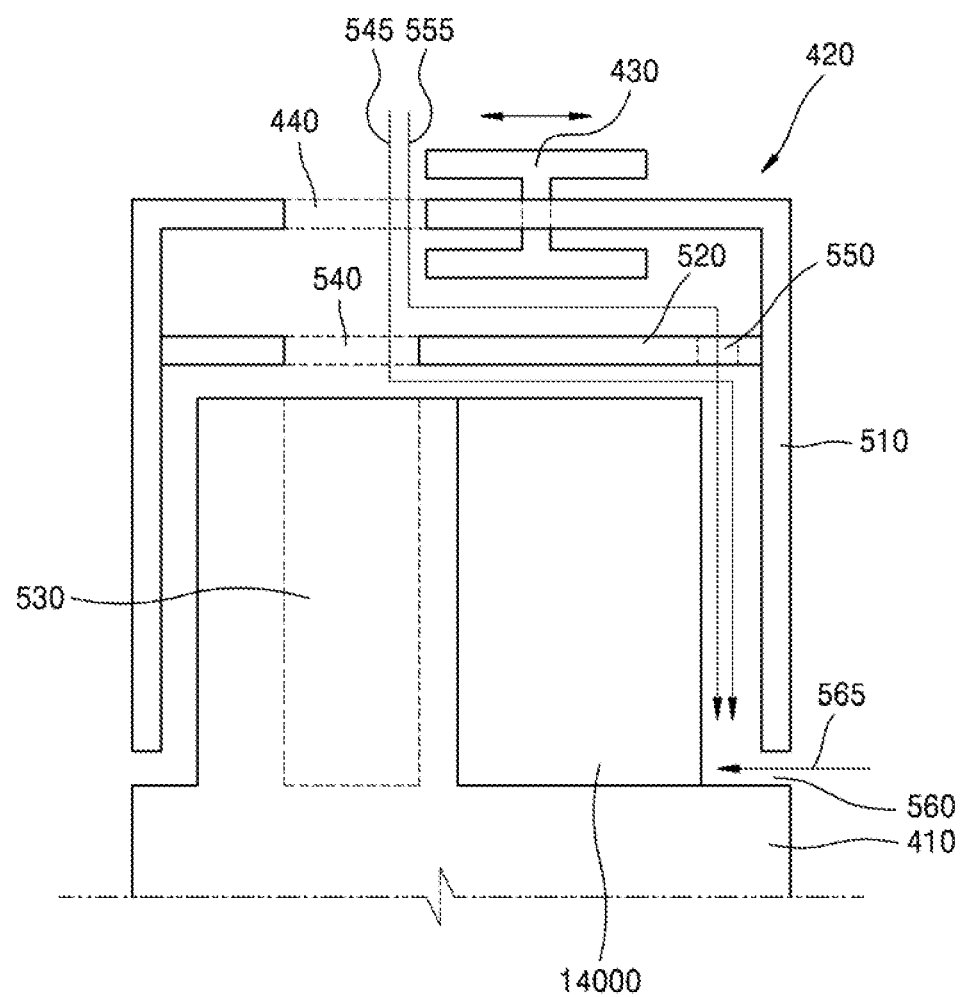
FIG. 5 is a cross-sectional view taken along line V-V of FIG. 4B to show a configuration of the aerosol generating device according to an exemplary embodiment.

FIG. 5 is a cross-sectional view taken along the line V-V of FIG. 48 to show a configuration of an aerosol generating device according to an exemplary embodiment.

Referring to FIG. 5, an example of a state in which the cover 420 of the aerosol generating device 10000 is coupled to the body portion 410 is illustrated. Meanwhile, FIG. 5 only shows elements of the aerosol generating device 10000 related to the present embodiment. Accordingly, it will be understood by those skilled in the art that the general purpose elements other than the elements shown in FIG. 5 may be further included in the aerosol generating device 10000.

The cover 420 may include an outer housing 510, a stopper 430, and an inner housing 520. At least one of the outer housing 510, the stopper 430, and the inner housing 520 may include a heat resistant material, and the heat resistant material may include a material capable of withstanding heat of 80° C. or more. Being capable of withstanding heat of 80° C. or more means that the melting point Tm of the heat resistant material is above 80° C.

Meanwhile, the heat resistant material may be a heat resistant synthetic resin. When the heat resistant material is the heat resistant synthetic resin, at least one of the melting point and a glass transition temperature Tg of the heat resistant material may be 80° C. or more.

For example, the heat resistant material may include at least one of, for example, polypropylene, polyether ether ketone (PEEK), polyethylene, polypropylene, polyethylene terephthalate, polycydohexylenedimethylene terephthalate, polyimide, sulfone resin, fluorine resin, and aramid. The sulfone resin may include a resin such as polyethylsulfone and polyphenylene sulfide, and the fluorine resin may include polytetrafluoroethylene (teflon).

However, the present disclosure is not limited thereto, and for example, the heat resistant material may be any suitable material capable of withstanding heat of 40° C. or more, and the heat resistant material may be any suitable material capable of withstanding heat of 100° C. or more. Further, for example, the heat resistant material may be any suitable material capable of withstanding heat of 130° C. or more, for example, the heat resistant material may be any suitable material capable of withstanding heat of 200° C. or more, for example, the heat resistant material may be any suitable material capable of withstanding heat of 300° C. or more, and for example, the heat resistant material may be any suitable material capable of withstanding heat of 400° C. or more.

In addition, the aerosol generating device 10000 may include a heat insulating portion on at least one of the inner and outer surfaces of the outer housing 510 and the inner housing 520. The heat insulating portion may include at least one heat insulating material. For example, the heat insulating portion may include any suitable material that blocks the movement of heat through the heat insulating portion. For example, the heat insulating portion may include at least one of a porous material, graphite, and ceramics, but is not limited thereto. The ceramic may be a porous ceramic.

The outer housing 510 may refer to a case forming an appearance of the cover 420. The outer housing 510 may include the first through hole 440 arranged to correspond to a receiving hole 530 that is formed in the body portion 410 so that the cigarette 20000 is inserted. The first through hole 440 may be disposed coaxially with the receiving hole 530.

The inner housing 520 may refer to a case forming the inner structure of the cover 420. The inner housing 520 may be spaced apart from the outer housing 510 to form a space so that the stopper 430 slides inside the outer housing 510.

At least a part of the stopper 430 may be covered by the inner housing 520 when viewed from the bottom of the outer housing 510.

The inner housing 520 may include a second through hole 540 that may be coaxially disposed with the first through hole 440. The second through hole 540 may be disposed to correspond to each other with the first through hole 440 and the receiving hole 530 and penetrated by the cigarette 20000. When the cigarette 20000 is inserted into the aerosol generating device 10000, the cigarette 20000 may pass through the first through hole 440, the second through hole 540, and the receiving hole 530 sequentially.

Each of the first through hole 440, the second through hole 540, and the receiving hole 530 may have a shape corresponding to the shape of the cigarette 20000. For example, when the cigarette 20000 is cylindrical, the shape of each of the first through hole 440, the second through hole 540, and the receiving hole 530 may be circular. However, the present disclosure is not limited thereto, and the shape of each of the first through hole 440, the second through hole 540, and the receiving hole 530 may be at least one of a circle, a semicircle, an ellipse, and a polygon. Meanwhile, the diameter of the first through hole 440 may be greater than the diameter of the cigarette 20000 such that a gap through which air passes is formed between the cigarette 20000 and the first through hole 440 when the cigarette 20000 is inserted into the receiving hole 530.

Among the plurality of passages that guide air to the entrance of the vaporizer 14000 along at least a part of the surface of the body portion 410, a first passage 545 may be formed between the inner housing 520 and the body portion 410 such that air flowing into the gap between the cigarette 20000 inserted into the receiving hole 530 and the first through hole 440 and passing through a second through hole 540 flows along the upper surface of the body portion 410. Meanwhile, the diameter of the second through hole 540 may be greater than the diameter of the cigarette 20000 such that a gap through which air flows is formed between the cigarette 20000 and the second through hole 540 when the cigarette 20000 is inserted into the receiving hole 530.

In an example, at least one of the outer housing 510 and the inner housing 520 may further include at least one support protrusion (not shown) to maintain an interval between the inner housing 520 and the body portion 410. A space may be formed between the inner housing 520 and the body portion 410 by the at least one support protrusion.

Meanwhile, the inner housing 520 may further include a third through hole 550 spaced apart from the second through hole 540. Among the plurality of passages that guide the air to the entrance of the vaporizer 14000 along at least a part of the surface of the body portion 410, the second passage 555 may be formed between the outer housing 510 and the inner housing 520 in order to guide the air that flows into the gap between the cigarette 20000 inserted into the receiving hole 530 and the first through hole 440 to the side of the body portion 410.

When the cigarette 20000 is inserted into the receiving hole 530, the air that flows into the gap between the cigarette 20000 and the first through hole 440 may flow along at least one of the first passage 545 extending to the entrance of the vaporizer 14000 through the second through hole 540 and the second passage 555 extending to the entrance of the vaporizer 14000 through the third through hole 550.

Because the inner housing 520 of the cover 420 further includes the third through hole 550 spaced apart from the second through hole 540, the second passage 555 may be further added besides the first passage 545, and accordingly, the flow of air flowing into the vaporizer 14000 included in the aerosol generating device 10000 may be smooth. In an example, the width of the first passage 545 may be smaller than the width of the second passage 555, and accordingly, the influence of the flow change in the air caused by the addition of the second passage 555 may increase. However, the present disclosure is not limited thereto. Hereinafter, an example of the inner housing 520 including the second through hole 540 and the third through hole 550 will be described in detail with reference to FIGS. 6A to 6D.

FIGS. 6A to 6D are bottom views of examples of an inner housing included in a cover for an aerosol generating device according to an exemplary embodiment.

Referring to FIGS. 6A to 6D, the inner housing 520 further includes the third through hole 550 spaced apart from the circular second through hole 540 corresponding to the shape of the cigarette 20000. The third through hole 550 may have various shapes and sizes. For example, referring to FIG. 6A, the third through hole 550 having a circular cross section is shown, referring to FIG. 6B, the third through hole 550 having a rectangular cross section is shown, and referring to FIG. 6C, the third through hole 550 having an elliptical cross section is shown. Meanwhile, the cross-sectional shape of the third through hole 550 is not limited to the configuration of the embodiment in FIGS. 6A to 6C, and may be any suitable shape. For example, the shape of the third through hole 550 may be at least one of a circle, a semicircle, an ellipse, and a polygon.

Meanwhile, the third through hole 550 may include one or more holes. For example, the third through hole 550 includes one hole in the exemplary embodiments shown in FIGS. 6A and 6B, and the third through hole 550 includes three holes in the exemplary embodiment shown in FIG. 6C. In the above embodiments, the number one or three is merely an example, and the third through hole 550 may include any suitable number of holes.

Figure 6A:
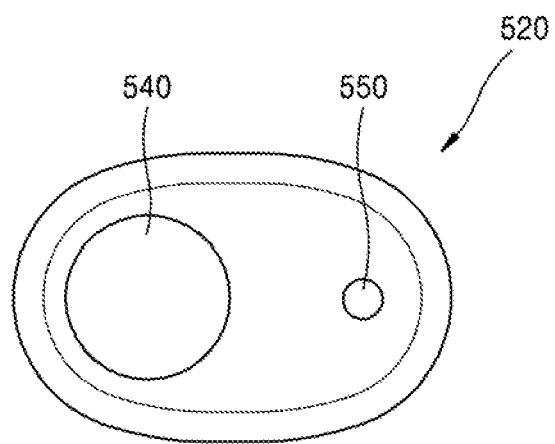
FIGS. 6A to 6D are bottom views of examples of an inner housing included in a cover for an aerosol generating device according to an exemplary embodiment.
Figure 6B:
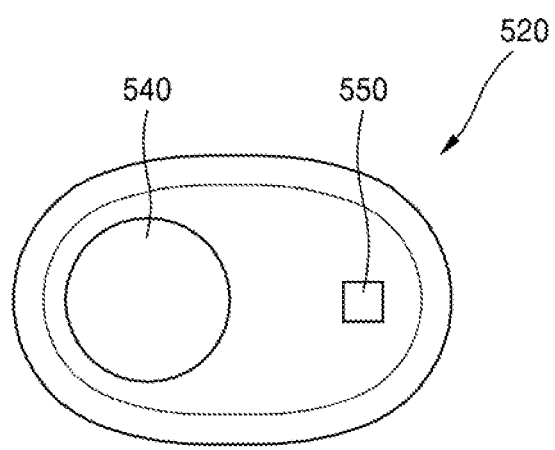
Figure 6C:
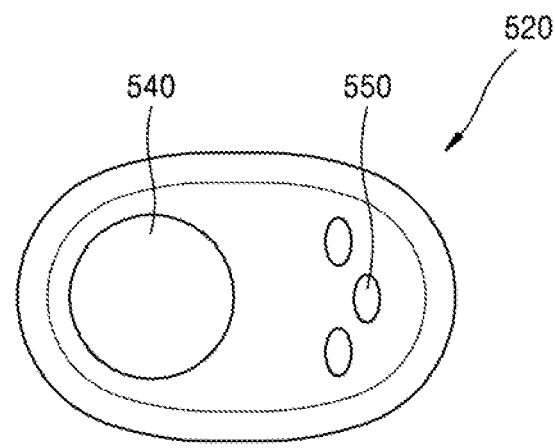
Figure 6D:
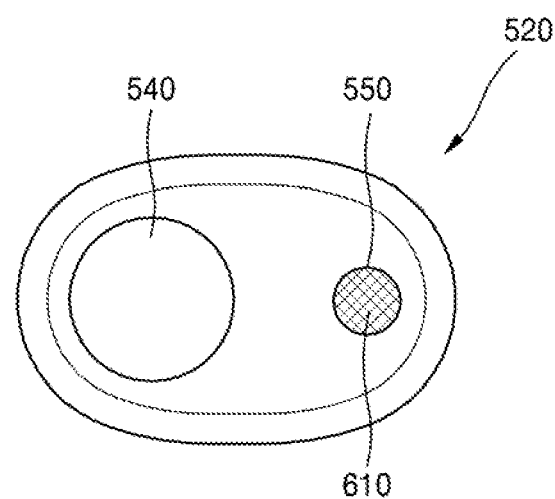

Meanwhile, referring to FIG. 6D, the inner housing 520 may further include a filter member 610 disposed in the third through hole 550 in addition to the second through hole 540 and the third through hole 550. The filter member 610 allows air to pass through a plurality of holes, and may filter foreign substances, thereby preventing droplets formed when an aerosol generated by the vaporizer 14000 is liquefied again from leaking out through the third through hole 550.

The filter member 610 may include a mesh material in which a plurality of holes are closely drilled like a mesh. Each of the plurality of holes included in the filter member 610 may have various sizes and various shapes. For example, first group of holes included in the filter member 610 may have the same size that is different from the size of a second group of. In addition, the shape of each of the plurality of holes included in the filter member 610 may be at least one of a square, a rectangle, a parallelogram, and a rhombus.

The filter member 610 may be a film or sheet shape structure such as a nonwoven fabric, and may include a polymer resin such as polyethylene, polypropylene, polyvinyl chloride resin, polyethylene terephthalate, nylon, epoxy, polyimide, polyester, urethane, acrylic, polycarbonate, urea, melanin, rubber chloride, polyvinyl alcohol, polyvinyl ester, vinylidene fluoride-hexafluoropropylene copolymer (PVDF-co-HFP), polyvinylidene fluoride (PVDF), polytetrafluoroethylene (PTFE), styrenebutadiene rubber (SBR), or ethylene-propylene-diene copolymer (EPDM).

Referring back to FIG. 5, the outer housing 510 may further include an air inlet 560 formed at a part where the outer housing 510 and the body portion 410 are connected when the outer housing 510 is coupled to the body portion 410. The air inlet 560 may be formed along at least a part of the circumference of the outer housing 510. For example, the air inlet 560 may be formed along the entire circumference of the outer housing 510, or may be formed only along a part of the circumference of the outer housing 510. Hereinafter, examples of the air inlet 560 formed by the outer housing 510 will be described in detail with reference to FIGS. 7A to 7C.

Figure 7A:
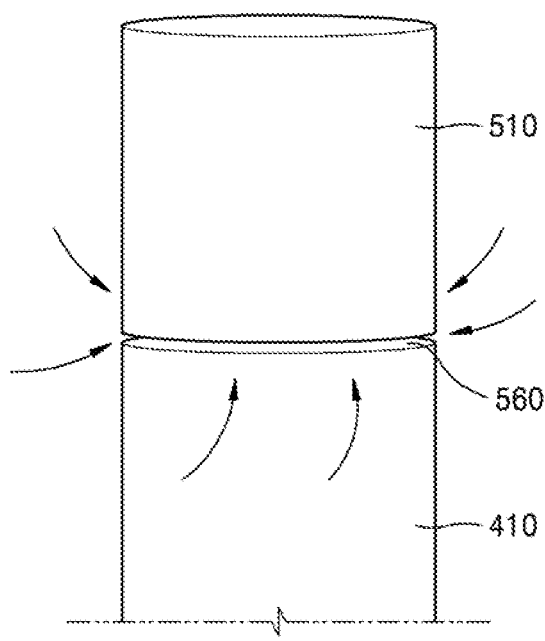
FIGS. 7A to 7C are diagrams illustrating examples of an air inlet formed by a cover for an aerosol generating device according to an exemplary embodiment.
Figure 7B:
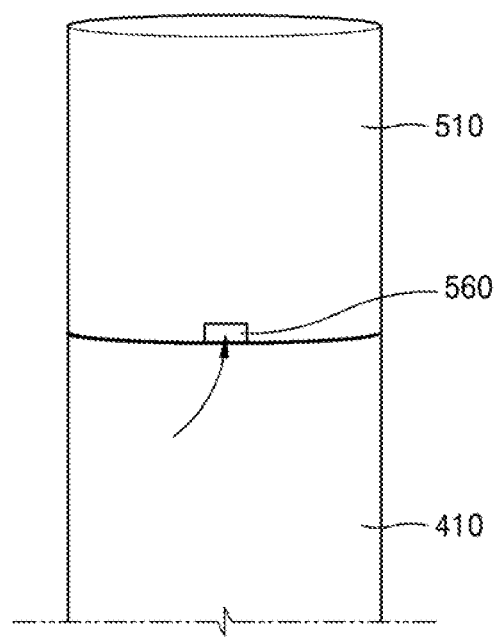
Figure 7C:
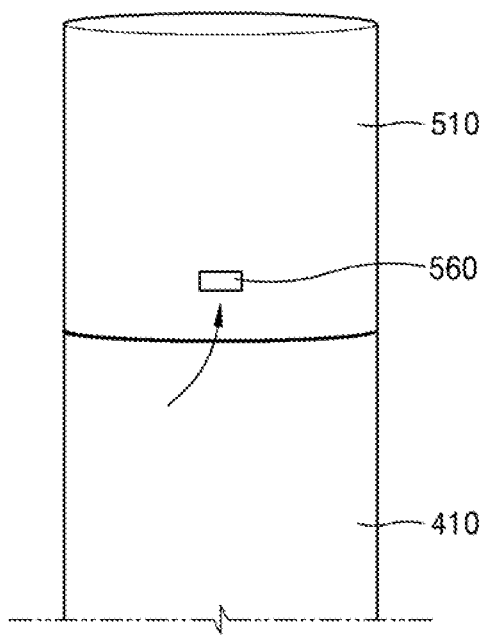

FIGS. 7A to 7C are diagrams illustrating examples of an air inlet formed by a cover for an aerosol generating device according to an exemplary embodiment.

Referring to FIG. 7A, the air inlet 560 may refer to a gap formed between the lower end of the outer housing 510 and the body portion 410 when the outer housing 510 and the body portion 410 are coupled. At this time, the air inlet 560 is formed along the entire circumference of the outer housing 510. Therefore, the outside air may flow into the aerosol generating device 10000 through the air inlet 560 along the entire circumference of the outer housing 510.

Referring to FIG. 7B, the air inlet 560 may mean a gap formed by a groove provided in the lower end of the outer housing 510 at a portion where the outer housing 510 and the body portion 410 are connected when the outer housing 510 is coupled to the body portion 410. At this time, the air inlet 560 is formed along a part of the circumference of the outer housing 510. In FIG. 7B, a rectangular groove is provided in the lower end of the outer housing 510, but is not limited thereto. A groove of any suitable shape may be provided in the lower end of the outer housing 510 to form the air inlet 560.

Meanwhile, as shown in FIG. 7C, the air inlet 560 may refer to a through hole formed spaced apart from the position where the outer housing 510 and the body portion 410 are connected to each other. In FIG. 7C, the cross section of the air inlet 560 has a rectangular shape, but is not limited thereto. The air inlet 560 may be a through hole having any suitable cross sectional shape. For example, the cross-sectional shape of the air inlet 560 may include at least one of a circle, a semicircle, an ellipse, and a polygon.

Meanwhile, although only one air inlet 560 is shown in FIGS. 7B and 7C, it will be readily understood by those skilled in the art that a plurality of air inlets 560 may be formed spaced apart along the outer circumference of the outer housing 510. In addition, it will be readily understood by those skilled in the art that the air inlets 560 shown in FIGS. 7A to 7C may be combined and included in the aerosol generating device 10000.

Referring back to FIG. 5, the cover 420 may further include a third passage 565 for guiding air that flows into through the air inlet 560 along at least a part of the surface of the body portion 410. For example, air inhaled through the air inlet 560 may flow along the third passage 565 extending from the air inlet 560 to the vaporizer 14000. Because the cover 420 further includes the air inlet 560 in addition to the second through hole 540 and the third through hole 550, the third passage 565 may be added besides the first passage 545 and the second passage 555, and accordingly, the flow of air flowing into the entrance of the vaporizer 14000 included in the aerosol generating device 10000 may be smooth.

End portions of a plurality of passages may be connected to each other at the entrance of the vaporizer 14000 such that air that flows into through each of the plurality of passages is induced to the entrance of the vaporizer 14000. Accordingly, air flowing through the first passage 545, air flowing through the second passage 555, and air flowing through the third passage 565 may all be combined at the entrance of the vaporizer 14000. The air combined at the entrance of the vaporizer 14000 may be delivered to a user through the cigarette 20000 along with the aerosol generated by the vaporizer 14000.

According to the structure of the cover 420 for the aerosol generating device 10000 according to the present disclosure, the plurality of passages for inducing air to the entrance of the vaporizer 14000 included in the aerosol generating device 10000 are formed, and thus the air flow in the aerosol generating device 10000 may be smooth, and the performance degradation of the aerosol generating device 10000 may be effectively prevented.

For example, Table 1 below is a table showing a degree of ease of inhalation of the user according to the combination of the first passage 545, the second passage 555 and the third passage 565. In Table 1, when 100 users perform a test of smoking cigarettes using an aerosol generating device 10000 including the combination of the first, second, and third passages 545, 555 and 565, ⊚ indicates that more than 85 users have determined that inhalation was easy, and ○ indicates that 50 to 80 users have determined that inhalation was easy, and X indicates that less than 50 users have determined that inhalation was easy.

TABLE 1

| Combination of passageways | Including only first passage | Including first passage and second passage | Including first passage and third passage | Including all of first, second, and third passages |
|---|---|---|---|---|
| Ease of Inhalation | X | ○ | ○ | ⊚ |

Table 1 shows that at least two or more passages should be formed by the cover 420 of the aerosol generating device 10000 such that the air flow in the aerosol generating device 10000 may be smooth, and the performance degradation of the aerosol generating device 10000 may be effectively prevented.

It will be understood by one of ordinary skill in the art that various changes in form and details may be made therein without departing from the spirit and scope of the invention as defined by the appended claims. Therefore, the disclosed methods should be considered from an illustrative point of view, not from a restrictive point of view. The scope of the present disclosure is defined by the appended claims rather than by the foregoing description, and all differences within the scope of equivalents thereof should be construed as being included in the present disclosure.

The invention claimed is:

1. An aerosol generating device comprising:
a body portion comprising:
a vaporizer comprising a first heater and a liquid storage configured to store a liquid composition and configured to generate aerosol by heating the liquid composition via the first heater;
a receiving hole configured to receive a cigarette;
a second heater configured to heat the cigarette; and
one or more air flow paths configured to cause the generated aerosol to pass through the cigarette and be discharged to outside; and
a cover coupled to the body portion and comprising a plurality of passages comprising a first passage and a second passage which guide air from the outside to an entrance of the vaporizer via different routes, the first passage and the second passage being independent from each other,
wherein the cover comprises an inner housing and an outer housing, the outer housing comprising a first through hole aligned with the receiving hole, the first through hole is being configured to receive the cigarette, and the first passage and the second passage are connected to the outside through the first through hole such that air moves from the outside to the first passage and the second passage through the first through hole,
wherein the first passage is formed between the inner housing and the body portion, and
wherein the second passage is formed between the outer housing and the inner housing.

2. The aerosol generating device of claim 1, wherein the cover further comprises
a stopper configured to open or close the first through hole by sliding along an upper end of the outer housing; and
wherein the inner housing is spaced apart from the outer housing to form a space such that the stopper slides inside the outer housing.

3. The aerosol generating device of claim 2,
wherein the inner housing comprises a second through hole disposed coaxially with the first through hole, and
wherein the first passage is formed between the inner housing and the body portion allows air flowing into a gap between the cigarette inserted into the receiving hole and the first through hole and passing through the second through hole to flow along an upper surface of the body portion.

4. The aerosol generating device of claim 3, wherein at least one of the outer housing and the inner housing further comprises at least one support protrusion configured to maintain an interval between the inner housing and the body portion.

5. The aerosol generating device of claim 3, wherein the inner housing further includes a third through hole spaced apart from the second through hole, and
wherein the second passage is formed between the outer housing and the inner housing guides the air that flows into the gap between the cigarette and the first through hole to a side of the body portion.

6. The aerosol generating device of claim 5, wherein a width of the first passage is less than a width of the second passage.

7. The aerosol generating device of claim 5, wherein a cross-sectional shape of the third through hole is at least one of a circle, a semicircle, an ellipse, and a polygon.

8. The aerosol generating device of claim 5, wherein the third through hole comprises a plurality of holes.

9. The aerosol generating device of claim 5, wherein the inner housing further comprises a filter member disposed on the third through hole and configured to filter foreign substances from air passing through the filter member.

10. The aerosol generating device of claim 2, wherein the outer housing further comprises an air inlet formed in a portion where the outer housing and the body portion are connected when the outer housing is coupled to the body portion, and
wherein the cover further comprises a third passage configured to guide air that flows in through the air inlet along at least part of a surface of the body portion.

11. The aerosol generating device of claim 10, wherein the air inlet extends along at least part of a circumference of the outer housing.

12. The aerosol generating device of claim 2, wherein the outer housing further includes an air inlet formed to be spaced apart from a portion where the outer housing and the body portion are connected when the outer housing is coupled to the body portion, and
    wherein the cover further comprises a third passage configured to guide air that flows in through the air inlet along at least part of a surface of the body portion.

13. The aerosol generating device of claim 1, wherein end portions of the plurality of passages are connected to each other at an entrance of the vaporizer such that air that flows in through each of the plurality of passages is directed to the entrance of the vaporizer.

14. The aerosol generating device of claim 2, wherein at least one of the outer housing and the inner housing comprises a heat-resistant material.

15. The aerosol generating device of claim 14, wherein the heat-resistant material comprises a material capable of withstanding heat of 80° C. or more.

\* \* \* \* \*